US012622119B2

(12) United States Patent
Tseng

(10) Patent No.: US 12,622,119 B2
(45) Date of Patent: May 5, 2026

(54) HEAT DISSIPATION STRUCTURE FOR LED LIGHT

(71) Applicant: Finesse Technology Co., Ltd., Hsinchu County (TW)

(72) Inventor: Shin-Hua Tseng, Hsinchu County (TW)

(73) Assignee: Finesse Technology Co., Ltd., Hsinchu County (TW)

( * ) Notice: Subject to any disclaimer, the term of this patent is extended or adjusted under 35 U.S.C. 154(b) by 122 days.

(21) Appl. No.: 18/895,375

(22) Filed: Sep. 24, 2024

(65) Prior Publication Data

US 2026/0026144 A1     Jan. 22, 2026

(30) Foreign Application Priority Data

Jul. 16, 2024     (TW) ................................. 113126584

(51) Int. Cl.
| | |
|---|---|
| *H10H 20/858* | (2025.01) |
| *H10W 70/60* | (2026.01) |
| *H10W 70/63* | (2026.01) |
| *H10W 72/00* | (2026.01) |
| *H10W 74/10* | (2026.01) |

(52) U.S. Cl.
CPC .... *H10H 20/8581* (2025.01); *H10H 20/8582* (2025.01); *H10H 20/8586* (2025.01); *H10W 70/60* (2026.01); *H10W 70/635* (2026.01); *H10W 72/877* (2026.01); *H10W 74/117* (2026.01)

(58) Field of Classification Search
CPC ........... H10H 20/8581; H10H 20/8586; H10H 20/8582; H10W 40/231; H10W 40/233; H10W 40/237; H10W 72/877; H10W 74/117; H10W 70/60; H10W 70/635
See application file for complete search history.

(56) References Cited

U.S. PATENT DOCUMENTS

| | | | | |
|---|---|---|---|---|
| 5,856,911 | A | 1/1999 | Riley | |
| 6,477,054 | B1 * | 11/2002 | Hagerup | ................ H05K 1/162 257/713 |

(Continued)

FOREIGN PATENT DOCUMENTS

| | | |
|---|---|---|
| JP | 2017175033 A | 9/2017 |
| JP | 2018186143 A | 11/2018 |

(Continued)

*Primary Examiner* — Alonzo Chambliss

(57)     ABSTRACT

Disclosed are an LED light and a heat dissipation device thereof. The LED light comprises at least one LED light bead disposed on the heat dissipation device. The heat dissipation device comprises a circuit board having a first metal layer and a second metal layer located on two opposite sides respectively; and a heat sink. The LED light bead is welded to the first metal layer. The second metal layer is welded to the heat sink. The circuit board has heat conductive holes, so that a heat energy generated by the LED light bead can be transferred to the heat sink through the heat conductive holes. Some of the heat conductive holes can be optionally filled with heat conductive material columns, so that the heat energy generated by LED light bead can be conducted to the heat sink through the heat conductive material columns in the heat conductive holes.

17 Claims, 5 Drawing Sheets

10

(56)      References Cited

U.S. PATENT DOCUMENTS

| 2009/0045432 A1* | 2/2009 | Kim | H05K 1/0206 |
| | | | 257/E23.001 |
| 2011/0037160 A1* | 2/2011 | Hsu | B81B 3/0018 |
| | | | 257/E21.507 |
| 2013/0062744 A1* | 3/2013 | Kim | H10W 40/228 |
| | | | 257/E23.031 |
| 2014/0226345 A1* | 8/2014 | Song | H10H 20/8506 |
| | | | 362/382 |
| 2016/0254211 A1 | 9/2016 | Hsieh et al. | |
| 2021/0126175 A1 | 4/2021 | West | |

FOREIGN PATENT DOCUMENTS

| JP | 2023168836 A | 11/2023 |
| TW | 200917518 A | 4/2009 |
| TW | 201248947 A | 12/2012 |
| TW | I445222 B | 7/2014 |
| TW | M661039 U | 9/2024 |
| WO | 2014166113 A1 | 10/2014 |

* cited by examiner

HEAT DISSIPATION STRUCTURE FOR LED LIGHT

CROSS-REFERENCE TO RELATED APPLICATION

This application claims priority from Taiwan Patent Application No. 113126584, filed on Jul. 16, 2024, each of which is hereby incorporated herein by reference in its entireties.

BACKGROUND OF THE DISCLOSURE

1. Field of Disclosure

The disclosure relates to a lamp and a heat dissipation device thereof, more particularly to a high heat dissipation light-emitting diode (LED) light and a heat dissipation device of the same.

2. Related Art

Light-emitting diode (LED) is a semiconductor component. The wavelength of light emitted by the LED varies depending on the materials used. At present, the photoelectric conversion efficiency of high-power LEDs is generally about 15%~25% of the input power becoming light, and the rest is converted into heat energy. Due to the small area of the LED chip, the heat density per unit area of high-power LEDs is very high, even more serious than that of ordinary IC components. This also causes the junction temperature of the LED chip to increase significantly, easily causing overheating problems. Excessively high chip junction temperature will reduce the luminous brightness of the LED, and will also cause the wavelength of the LED to shift, affecting the quality and specifications, and significantly reducing the service life of the LED. Therefore, the heat dissipation design of LED-related products is very important.

At present, the commonly used welding method for high-power LEDs is to first weld the LED to an aluminum substrate or a copper substrate, and then connect the aluminum substrate or the copper substrate to the heat sink with heat dissipation glue. However, this conventional connection method needs to pass through the insulating layer on the substrate, making it impossible to achieve good heat conduction and heat dissipation effects.

PCT Patent No. WO2014166113A1 (entitled: highly heat-conductive LED welding method) discloses a highly heat-conductive LED welding method, comprising the following steps: welding electrodes of the LED to a circuit board using high-temperature soldering tin; directly welding a heat-dissipation pole plate of the LED to a heat dissipation device using low-temperature soldering tin; and directly contacting the heat-dissipation pole plate of the LED with the heat dissipation device, so that the LED has good effects of heat conduction and heat dissipation. However, the method disclosed in this patent will significantly increase the difficulty and technics costs of circuit board production.

In addition, Taiwan Patent No. TW201248947A (entitled: thermal structure for LED device) discloses that the circuit board is provided with multiple heat conduction circuits. The heat conduction circuits are connected to the heat conduction area of the LED, the circuit board and the heat dissipation plate are locked together with screws, and the screws are in contact with the heat conduction circuits of the LED. The heat conduction path of this patent is: the LED heat conduction area, the circuit board circuits, the screws and the heat dissipation plate. However, this heat conduction method is limited by the small areas of the heat conduction circuits and the screws, resulting in limited heat dissipation effects.

SUMMARY OF THE DISCLOSURE

In view of this, in order to solve the problems of declined LED specifications, quality and shortened service life due to excessive heat generation of LEDs, an object of the disclosure is to provide an LED light and a heat dissipation device of the same. The disclosure uses materials with high thermal conductivity coefficients such as solder tin or silver glue, and heat conductive holes to replace conventional heat dissipation glue and screws, enabling the solder tin/silver glue to be directly connected to a heat sink to achieve effective heat dissipation. Compared with the prior art, a circuit board of the disclosure can achieve good heat dissipation effects using a commercially available circuit board without requiring complicated circuit design and high technics costs.

In order to achieve the above object, the disclosure discloses an LED light comprising at least one LED light bead; and a heat dissipation device, wherein the LED light bead is disposed on the heat dissipation device to eliminate a heat energy generated by the LED light bead through the heat dissipation device.

In order to achieve the above object, the disclosure further discloses a heat dissipation device applicable for eliminating a heat energy generated by at least one LED light bead, comprising: a circuit board equipped with at least one first metal layer and at least one second metal layer respectively located on two opposite sides, the circuit board has at least one heat conductive hole, wherein the first metal layer of the circuit board is connected to a heat dissipation base of the LED light bead through a first heat conductive material layer, so that the heat energy generated by the LED light bead is transferred from the heat dissipation base to the second metal layer of the circuit board through the first heat conductive material layer, the first metal layer and the heat conductive hole; and a heat sink, wherein the second metal layer of the circuit board is connected to the heat sink through a second heat conductive material layer, so that the heat energy generated by the LED light bead is conducted from the second metal layer to the heat sink through the second heat conductive material layer.

Preferably, an area of the second metal layer of the circuit board is at least larger than an area of the heat sink connected to the second metal layer of the circuit board through the second heat conductive material layer.

Preferably, a position where the heat conductive hole being formed on the circuit board is located in an area where the heat dissipation base of the LED light bead is connected to the first metal layer of the circuit board via the first heat conductive material layer.

Preferably, the heat conductive hole is filled with at least one heat conductive material column connecting with the first heat conductive material layer and the second heat conductive material layer, and the at least one heat conductive material column is used to conduct the heat energy generated by the LED light bead from the first heat conductive material layer to the second heat conductive material layer.

Preferably, materials of the first heat conductive material layer, the second heat conductive material layer and/or the heat conductive material column are respectively selected from a group consisting of solder tin and silver glue.

Preferably, materials of the first heat conductive material layer, the second heat conductive material layer and/or the heat conductive material column are heat conductive adhesives respectively.

Preferably, the heat conductive hole is formed with a third metal layer on an inner wall of the circuit board to connect with the first metal layer and the second metal layer, and the heat energy generated by the LED light bead is transferred from the heat dissipation base to the second metal layer of the circuit board through the first heat conductive material layer, the first metal layer, the heat conductive hole and the third metal layer in the heat conductive hole.

Preferably, the circuit board is a copper foil circuit board, and the first metal layer and/or the second metal layer are respectively a copper foil or is a copper foil.

Preferably, a material of the heat sink is a pure copper metal.

Preferably, the heat sink is a copper column radiating fin, a water-cooling heat sink, a fan-assisted copper column radiating fin or a fan-assisted water-cooling heat sink.

Preferably, a number of the heat conductive hole is more than one, a plurality of first heat conductive holes among the heat conductive holes are respectively filled with a heat conductive material column, and a plurality of second heat conductive holes among the heat conductive holes are hollow.

Preferably, positions where the first heat conductive holes being formed on the circuit board are located in an area where the heat dissipation base of the LED light bead is connected to the first metal layer of the circuit board via the first heat conductive material layer, and positions where the second heat conductive holes being formed on the circuit board are located outside the area where the heat dissipation base of the LED light bead is connected to the first metal layer of the circuit board via the first heat conductive material layer.

Preferably, the circuit board is a double-layer board or a multi-layer board.

In order to achieve the above object, the disclosure further discloses a heat dissipation device applicable for eliminating a heat energy generated by at least one LED light bead, comprising: a copper foil circuit board equipped with at least one first copper foil and at least one second copper foil located on two opposite sides, the LED light bead is welded to the first copper foil; and a heat sink, the heat sink is welded to the second copper foil, the copper foil circuit board has at least one copper-plated heat conductive hole, so that the heat energy generated by the LED light bead is transferred to the heat sink through the copper-plated heat conductive hole.

Preferably, an area of the second copper foil is larger than an area of the heat sink where the second copper foil is welded.

Preferably, a number of the at least one copper-plated heat conductive hole is more than one, and among the copper-plated heat conductive holes, only at least one first copper-plated heat conductive hole located in a welding area between the heat sink and the second copper foil is filled with solder tin or silver glue.

Preferably, at least one second copper-plated heat conductive hole among the copper-plated heat conductive holes located outside the welding area between the heat sink and the second copper foil is not filled with solder tin or silver glue.

In order to achieve the above object, the disclosure further discloses an LED light, comprising: at least one LED light bead; and the heat dissipation device as claimed in claim 1, wherein the LED light bead is disposed on the heat dissipation device for eliminating the heat energy generated by the LED light bead through the heat dissipation device.

Based on the above, the LED light and the heat dissipation device of the same of the disclosure have the following advantages:

(1) The disclosure uses materials with high thermal conductivity coefficients such as solder tin or silver glue, and the heat conductive hole to replace conventional heat dissipation glue and screws, enabling the solder tin/silver glue to be directly connected to the heat sink to achieve effective heat dissipation, thereby improving heat dissipation effects.

(2) Compared with the prior art, the circuit board of the disclosure can achieve good heat dissipation effects using a commercially available circuit board without requiring complicated circuit design and high technics costs.

(3) The copper foil circuit board of the heat dissipation device of the disclosure can be provided with the copper-plated heat conductive holes, wherein some of the copper-plated heat conductive holes are filled with the heat conductive material columns to connect to the LED light bead and the heat sink, and some of the copper-plated heat conductive holes are not filled with the heat conductive material columns, thereby the disclosure can provide a first type heat conduction path and a second type heat conduction path, making the LED light become a high heat dissipation LED light.

(4) A sequence of the first type heat conduction path provided by the disclosure is (a) the heat dissipation base of the LED light bead; (b) the first heat conductive material layer/the first metal layer/a third metal layer in the heat conductive hole/the heat conductive material columns under the heat dissipation base; (c) the second heat conductive material layer/the second metal layer on another side of the circuit board; and (d) the heat sink. A sequence of the second type heat conduction path is (a) the heat dissipation base; (b) the first heat conductive material layer/the first metal layer under the heat dissipation base; (c) the heat conductive holes around the heat dissipation base/the third metal layer in the heat conductive holes; (d) the second heat conductive material layer/the second metal layer on the other side of the circuit board; and (e) the heat sink.

(5) The heat dissipation device of the disclosure enables the first heat conductive material layer and the second heat conductive material layer to directly connect with the LED light bead and the heat sink respectively, and the first heat conductive material layer and the second heat conductive material layer can be connected with each other through the heat conductive material columns and/or the first metal layer, the second metal layer and the third metal layer of the circuit board. The LED light of the disclosure can achieve effective heat dissipation and improve heat dissipation effects by directly connecting the LED light bead and the heat sink, for example, with solder tin/silver glue.

(6) An area of the second metal layer of the circuit board is larger than an area of the second metal layer of the circuit board connected to the heat sink through the second heat conductive material layer, thereby improving heat dissipation effects.

(7) Disposing positions of the heat conductive material columns are located at a connection area (such as a welding area) between the LED light bead and the circuit board and at a connection area (such as a welding area) between the heat sink and the circuit board, thereby improving heat dissipation effects.

(8) The LED light of the disclosure can be a high-power LED light.

In order to enable the examiner to have a further understanding and recognition of the technical features of the disclosure, preferred embodiments in conjunction with detailed explanation are provided as follows.

DETAILED DESCRIPTION OF THE DISCLOSURE

Figure 1:
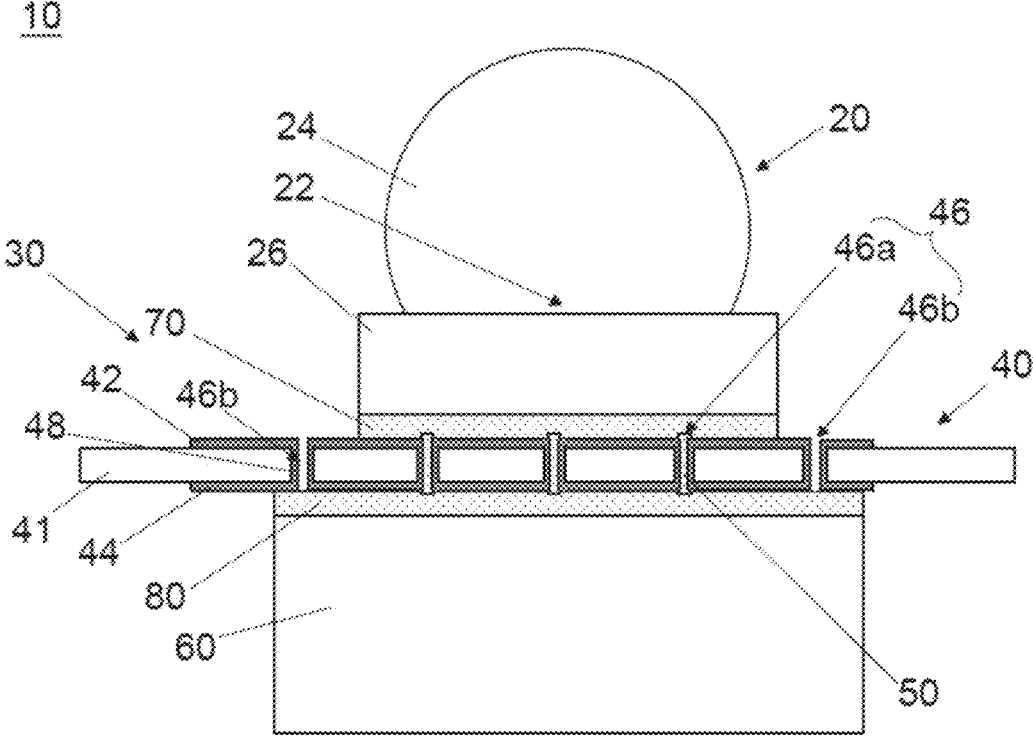
FIG. 1 is across-sectional view of a LED light bead of a LED light of the disclosure disposed on a heat dissipation device.

In order to understand the technical features, content and advantages of the disclosure and its achievable efficacies, the disclosure is described below in detail in conjunction with the figures, and in the form of embodiments, the figures used herein are only for a purpose of schematically supplementing the specification, and may not be true proportions and precise configurations after implementation of the disclosure; and therefore, relationship between the proportions and configurations of the attached figures should not be interpreted to limit the scope of the claims of the disclosure in actual implementation. In addition, in order to facilitate understanding, the same elements in the following embodiments are indicated by the same referenced numbers. And the size and proportions of the components shown in the drawings are for the purpose of explaining the components and their structures only and are not intending to be limiting.

Unless otherwise noted, all terms used in the whole descriptions and claims shall have their common meaning in the related field in the descriptions disclosed herein and in other special descriptions. Some terms used to describe in the present disclosure will be defined below or in other parts of the descriptions as an extra guidance for those skilled in the art to understand the descriptions of the present disclosure.

The terms such as "first", "second", "third", "fourth" used in the descriptions are not indicating an order or sequence, and are not intending to limit the scope of the present disclosure. They are used only for differentiation of components or operations described by the same terms.

Moreover, the terms "comprising", "including", "having", and "with" used in the descriptions are all open terms and have the meaning of "comprising but not limited to".

Figure 2:
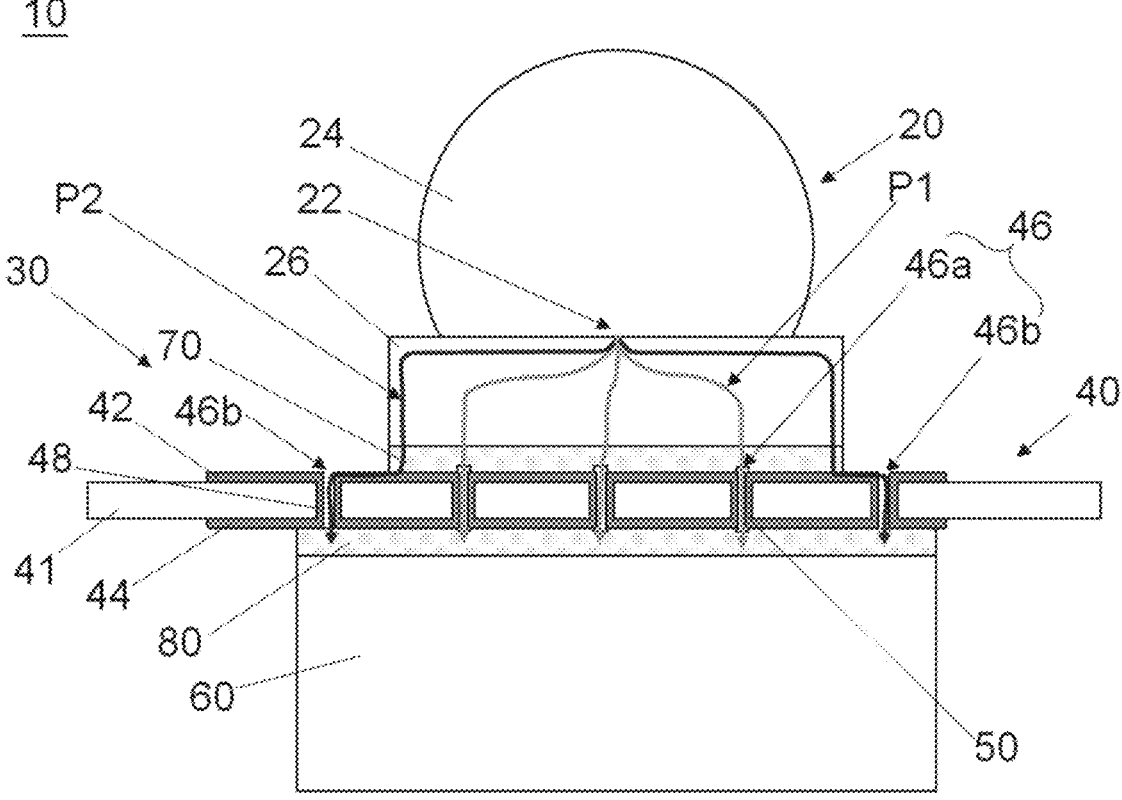
FIG. 2 is a schematic diagram of heat conduction of the LED light bead of the LED light of the disclosure disposed on the heat dissipation device.
Figure 3:
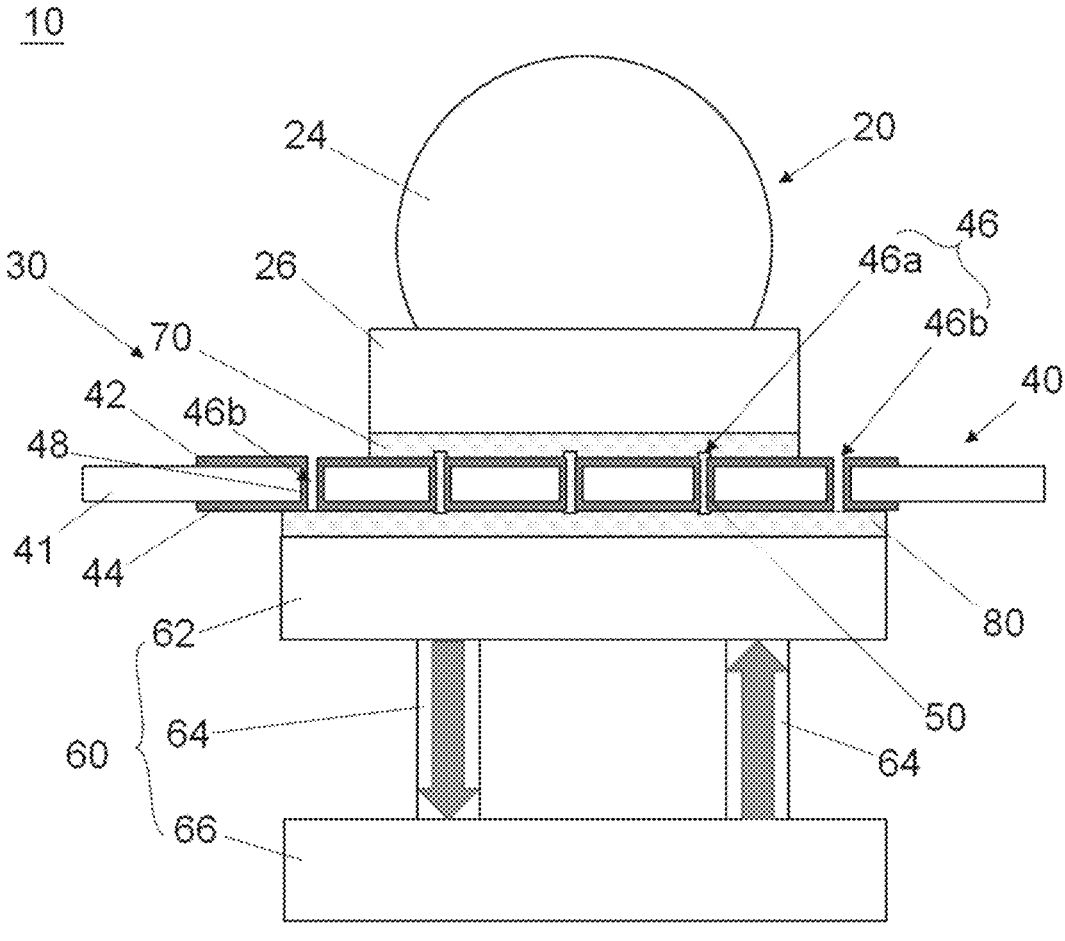
FIG. 3 is a cross-sectional view of the LED light bead of the LED light of the disclosure disposed on the heat dissipation device, wherein the heat dissipation device has a water-cooling heat sink.
Figure 4:
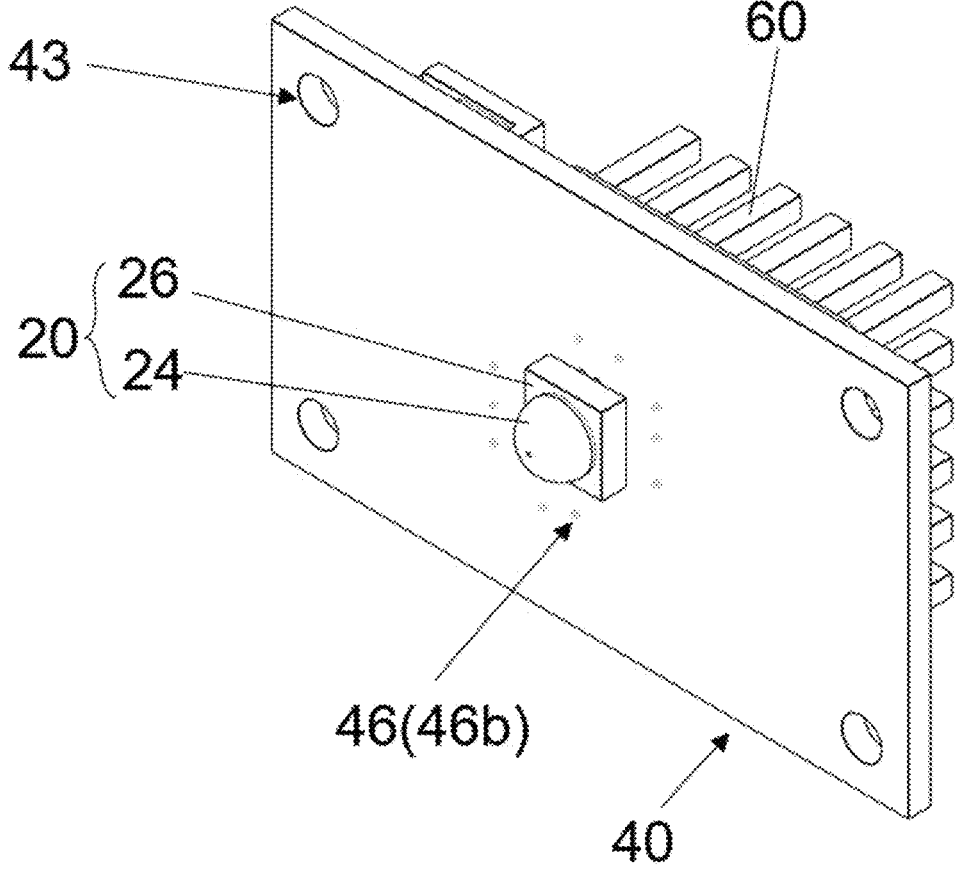
FIG. 4 is a perspective view of the LED light bead of the LED light of the disclosure disposed on the heat dissipation device.
Figure 5:
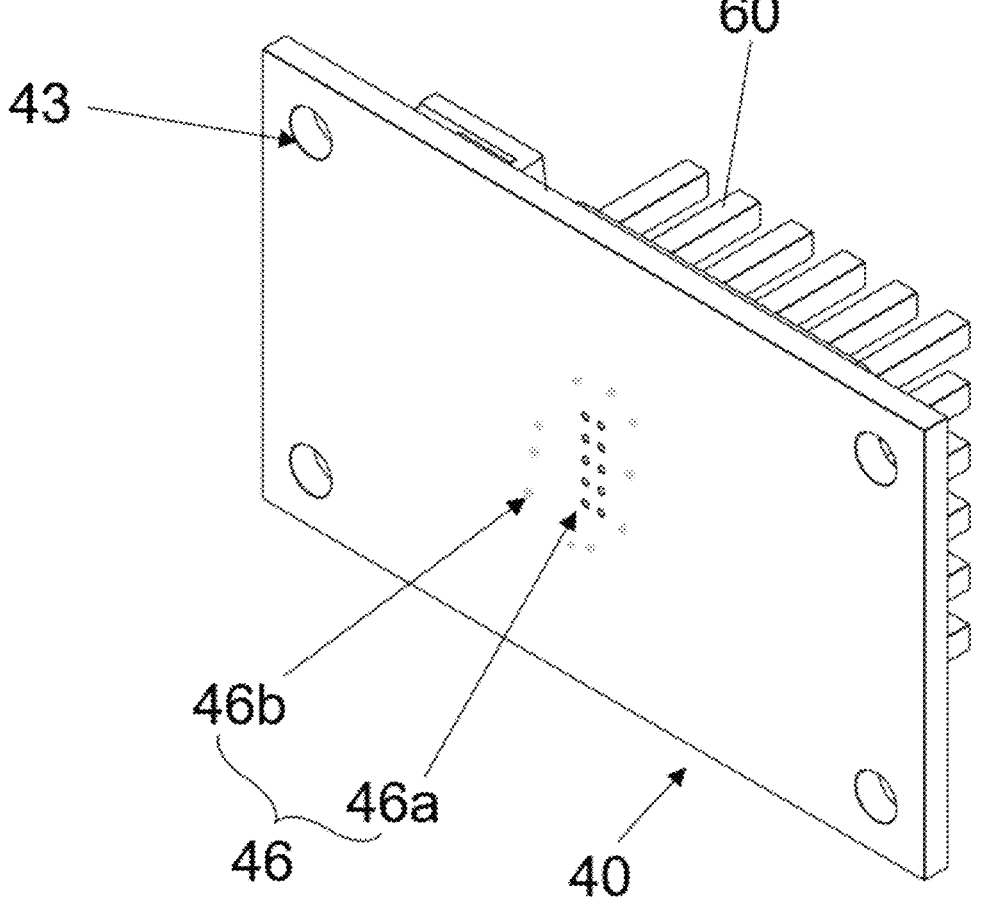
FIG. 5 is a perspective view of the heat dissipation device of the LED light of the disclosure.

FIG. 1 is across-sectional view of a LED light bead of a LED light of the disclosure disposed on a heat dissipation device. FIG. 2 is a schematic diagram of heat conduction of the LED light bead of the LED light of the disclosure disposed on the heat dissipation device. FIG. 3 is a cross-sectional view of the LED light bead of the LED light of the disclosure disposed on the heat dissipation device, wherein the heat dissipation device has a water-cooling heat sink. FIG. 4 is a perspective view of the LED light bead of the LED light of the disclosure disposed on the heat dissipation device. FIG. 5 is a perspective view of the heat dissipation device of the LED light of the disclosure.

Please refer to FIGS. 1 to 5. An LED light 10 of the disclosure comprises at least one LED light bead 20 and a heat dissipation device 30. The LED light bead 20 is disposed on the heat dissipation device 30. The heat dissipation device 30 comprises a circuit board 40 and a heat sink 60. The heat dissipation device 30 is applicable for eliminating a heat energy generated by the at least one LED light bead 20 to an external environment through the circuit board 40 and the heat sink 60, so that the LED light 10 can be a high heat dissipation LED light. A number of the at least one LED light bead 20 can be one or more than one. In order to facilitate explanation of operation of the disclosure, the disclosure takes the LED light bead 20 with a LED chip 22 disposed on a heat dissipation base 26 and covered with a cover 24 as an example, but is not limited thereto. The LED light bead 20 of the LED light 10 applied in the disclosure is not limited to specific types, structures and circuit configurations, and can be appropriately modified or replaced according to actual requirements, such as omitting the cover 24 and/or the heat dissipation base 26, or can be replaced with other structures, and can also be optionally commercially available LED light beads of various types, structures and circuit configurations.

The circuit board 40 of the heat dissipation device 30 of the disclosure has at least one first metal layer 42 and at least one second metal layer 44 respectively located on two opposite sides. For example, the first metal layer 42 and the second metal layer 44 are located on two opposite sides of a substrate 41 of the circuit board 40. The circuit board 40 of the heat dissipation device 30 of the disclosure has at least one heat conductive hole 46, such as the heat conductive hole 46 or the heat conductive holes 46. The heat conductive hole 46, for example, penetrates the substrate 41, and optionally penetrates the first metal layer 42 and the second metal layer 44. The heat conductive hole 46 can optionally be formed with a third metal layer 48 on an inner wall of the circuit board 40 to connect with the first metal layer 42 and the second metal layer 44, so that the heat conductive hole 46 becomes a metal-plated heat conductive hole. The circuit board 40 is, for example, a copper foil circuit board, the first metal layer 42 and/or the second metal layer 44 are/is, for example, copper foils respectively or a copper foil, and the third metal layer 48 is a copper foil, so that the heat conductive hole 46 becomes a copper-plated heat conductive hole. The heat conductive hole 46 can optionally be arranged in an array, but it is not limited thereto, as long as heat dissipation effects of the disclosure can be achieved, any material or structure falls within the scope of protection claimed by the disclosure. In addition, the circuit board 40, the first metal layer 42, the second metal layer 44 and the third metal layer 48 of the disclosure are not limited to specific sizes or thicknesses. Similarly, there is no particular limitation on a hole diameter of the heat conductive hole 46 or a distance between the two heat conductive holes 46 of the disclosure, as long as heat dissipation effects of the disclosure can be achieved, any size or hole diameter falls within the scope of protection claimed by the disclosure.

The circuit board 40 of the heat dissipation device 30 of the disclosure can be, for example, a commercially available printed circuit board, and can be, for example, a double-layer board or a multi-layer board. Therefore, a type of the substrate 41 of the circuit board 40 can be correspondingly changed based on a type of the circuit board 40. Taking a commercially available double-layer board as an example, two opposite sides of the substrate 41 are covered with two metal layers (such as copper foil). The substrate 41 is, for example, a dielectric material layer, such as a glass fiber board, an epoxy resin board or a composite board thereof. Taking a commercially available multi-layer board as an example, the two opposite sides of the substrate 41 are covered with two metal layers (such as copper foil), and the substrate 41 comprises a plurality of intermediate layers, such as a stacked structure of a plurality of dielectric material layers and a plurality of metal layers, and has the metal-plated heat conductive holes 46 respectively located at a same stacked layer or between different stacked layers. Since those having ordinary skill in the art to which the disclosure pertains should understand how to implement commercially available circuit boards and/or commercially available LED light beads to achieve the technical effects of the disclosure based on the disclosure of the disclosure, no further details are provided here. In addition, the circuit board 40 can also optionally have other structures, such as screw holes 43, etc., thereby the circuit board 40 can be locked to other objects (not shown in the figures), for example.

One feature of the disclosure is that the at least one heat conductive hole 46 is formed on the circuit board 40 to improve heat dissipation effects. In one implementation mode, a position where the heat conductive hole 46 being formed on the circuit board 40 can be, for example, located in an area where the heat dissipation base 26 of the LED light bead 20 is connected to the first metal layer 42 of the circuit board 40 via a first heat conductive material layer 70. Taking a material of the first heat conductive material layer 70 as solder tin as an example, the heat conductive hole 46 of the circuit board 40 can be located in a welding area between the LED light bead 20 and the first metal layer 42, thereby the heat conductive hole 46 in a welding area can be partially or fully adsorbed with solder tin, and can even be connected to the second metal layer 44 located on another side of the circuit board 40, for example. Wherein the heat conductive holes 46 adsorbed with solder tin are preferably only located in a welding area between the LED light bead 20 and the first metal layer 42, which means that the heat conductive holes 46 outside a welding area are preferably not adsorbed with solder tin in order to avoid electrical conduction.

The first metal layer 42 of the circuit board 40 of the heat dissipation device 30 of the disclosure is connected to the heat dissipation base 26 of the LED light bead 20 through the first heat conductive material layer 70, so that the heat energy generated by the LED light bead 20 can be conducted from the heat dissipation base 26 to the second metal layer 44 of the circuit board 40 through the first heat conductive material layer 70, the first metal layer 42 and the third metal layer 48 in the heat conductive hole 46 along a second type heat conduction path P2 shown in FIG. 2. Specifically, a sequence of the second type heat conduction path P2 provided by the disclosure is (a) the heat dissipation base 26 of the LED light bead 20; (b) the first heat conductive material layer 70/the first metal layer 42 under the heat dissipation base 26; (c) the third metal layers 48 in the heat conductive holes 46 around the heat dissipation base 26; (d) a second heat conductive material layer 80/the second metal layer 44 on the other side of the circuit board 40; and (e) the heat sink 60.

In this implementation mode, the heat conductive hole 46 is optionally filled with at least one heat conductive material column 50 connecting with the first heat conductive material layer 70 and the second heat conductive material layer 80, the at least one heat conductive material column 50 (even, or for example, also through the first metal layer 42, the heat conductive material column 50/the third metal layer 48 and the second metal layer 44) is used to conduct the heat energy generated by the LED light bead 20 from the first heat conductive material layer 70 to the second heat conductive material layer 80 along a first type heat conduction path P1 shown in FIG. 2. The heat conductive material column 50 is located in the heat conductive hole 46 (for example, protrudes to reach outer sides of one end or two ends of the heat conductive hole 46), and a position where the heat conductive hole 46 being formed on the circuit board 40 can be, for example, located in an area where the heat dissipation base 26 of the LED light bead 20 is connected to the first metal layer 42 of the circuit board 40 via the first heat conductive material layer 70. Taking a material of the first heat conductive material layer 70 as solder tin as an example, the heat conductive material column 50 is formed in the heat conductive hole 46 on the circuit board 40 at a position located in a welding area between the LED light bead 20 and the first metal layer 42. Wherein a disposing position of the heat conductive material column 50 is preferably located between the LED light bead 20 and the heat sink 60, for example, located in a welding area between the heat dissipation base 26 of the LED light bead 20 and the circuit board 40 and located in a welding area between the heat sink 60 and the circuit board 40, so that the heat energy generated by the LED light bead 20 can be directly conducted from the heat dissipation base 26 to the heat sink 60. Specifically, a sequence of the first type heat conduction path P1 provided by the disclosure is (a) the heat dissipation base 26 of the LED light bead 20; (b) the first heat conductive material layer 70/the first metal layer 42/the third metal layer 48 in the heat conductive hole 46/the heat conductive material columns 50 under the heat dissipation base 26; (c) the second heat conductive material layer 80/the second metal layer 44 on the other side of the circuit board 40; and (d) the heat sink 60.

A number of the heat conductive hole 46 can be one or more than one, such as a plurality of first heat conductive holes 46a and a plurality of second heat conductive holes 46b. A number of the heat conductive material column 50 can be one or more than one, and can be located in all or part of the heat conductive holes 46, for example. Taking the heat conductive holes 46 and the heat conductive material columns 50 as an example, the heat conductive material columns 50 are preferably only filled in part of the heat conductive holes 46 (such as the first heat conductive holes 46a), and the heat conductive material columns 50 are preferably located only in a welding area between the LED light bead 20 and the first metal layer 42 to improve heat dissipation effects. The heat conductive material columns 50 are preferably not filled in another part of the heat conductive holes 46 (such as the second heat conductive holes 46b) to avoid electrical conduction. Disposing positions of the first heat conductive holes 46a are preferably located at a welding area between the heat sink 60 and the circuit board 40, and located at a welding area between the heat dissipation base 26 and the circuit board 40. Disposing positions of the second heat conductive holes 46b are preferably located at a welding area between the heat sink 60 and the circuit board 40, and located outside a welding area between the heat dissipation base 26 and the circuit board 40. In the LED light 10 of the disclosure, the first heat conduction holes 46*a* and the heat conduction material columns 50 are, for example, distributed under the heat dissipation base 26 of the LED light bead 20, and the second heat conduction holes 46*b* are, for example, distributed around the heat dissipation base 26 of the LED light bead 20. Materials of the first heat conductive material layer 70, the second heat conductive material layer 80 and/or the heat conductive material columns 50 are, for example, heat conductive adhesives respectively, such as solder tin or silver glue, or other high heat conductive solders instead, but are not limited thereto. Silver glue, for example, can have high heat conductivity.

The heat dissipation device 30 of the disclosure further has the heat sink 60, a material thereof is, for example, pure copper metal. The second metal layer 44 of the circuit board 40 is connected to the heat sink 60 through the second heat conductive material layer 80, so that the heat energy generated by the LED light bead 20 can be conducted from the second metal layer 44 to the heat sink 60 through the second heat conductive material layer 80 along the first type heat conduction path P1 and/or the second type heat conduction path P2. Taking a material of the second heat conductive material layer 80 as solder tin as an example, the second metal layer 44 of the circuit board 40 is soldered to the heat sink 60 through the second heat conductive material layer 80. Preferably, an area of the second metal layer 44 needs to be larger than an area of a welding area between the second metal layer 44 and the heat sink 60. For example, as shown in FIGS. 1 to 3, the second metal layer 44 protrudes from outer sides of the welding area. In the LED light 10 of the disclosure, the heat dissipation base 26 of the LED light bead 20 and the heat sink 60 of the heat dissipation device 30 are directly connected to the first heat conductive material layer 70 and the second heat conductive material layer 80 respectively. The first heat conductive material layer 70 and the second heat conductive material layer 80 can be connected to each other through the heat conductive material columns 50 and/or the first metal layer 42, the second metal layer 44 and the third metal layer 48 of the circuit board 40. In other words, the LED light 10 of the disclosure uses solder tin/silver glue (i.e., the first heat conductive material layer 70 and the second heat conductive material layer 80 and the heat conductive material columns 50) to enable the LED light bead 20 and the heat sink 60 of the heat dissipation device 30 to directly connect to each other, thereby improving heat dissipation effects and achieving effective heat dissipation.

Another feature of the disclosure is that the circuit board 40 retains the second metal layer 44 with a large area, wherein an area of the second metal layer 44 of the circuit board 40 is at least larger than an area of the heat sink 60 connected to the second metal layer 44 of the circuit board 40 through the second heat conductive material layer 80. Taking a material of the second heat conductive material layer 80 as solder tin as an example, an area of the second metal layer 44 of the circuit board 40 is at least larger than an area of the heat sink 60 soldered to the second metal layer 44 of the circuit board 40 through the second heat conductive material layer 80 (that is, an area of a welding area between the second metal layer 44 and the heat sink 60), thereby improving heat dissipation effects.

A material of the heat sink 60 is, for example, pure copper metal, but is not limited thereto. The heat sink 60 can be, for example, a heat dissipation component such as a copper column radiating fin, a water-cooling heat sink, a fan-assisted copper column radiating fin, or a fan-assisted water-cooling heat sink, but is not limited thereto. Taking the heat sink 60 as a copper column radiating fin as an example, the heat sink 60 has a plurality of copper columns, so that the heat energy generated by the LED light bead 20 can be discharged externally through the copper columns. Taking the heat sink 60 as a water-cooling heat sink (a water-cooling channel heat sink as shown in FIG. 3) as an example, the heat sink 60 comprises a water-cooling head 62, two channel tubes 64 and a heat radiator 66. Wherein the two channel tubes 64 are connected to the heat radiator 66 respectively, wherein a flow direction of an aqueous solution is as shown by arrows. The aqueous solution can transfer a heat energy of the water-cooling head 62 to the heat radiator 66 through one of the two channel tubes 64. The cooled aqueous solution then flows back to the water-cooling head 62 for continued recycling through the other channel tube 64. In addition, the heat sink 60 of the disclosure can optionally be equipped with a fan (not shown in the figures) to form a fan-assisted copper column radiating fin or a fan-assisted water-cooling heat sink.

In addition, in another implementation mode of the disclosure, the disclosure provides the LED light 10 and the heat dissipation device 30 of the same. The LED light bead 20 is disposed on the heat dissipation device 30. The heat dissipation device 30 is applicable for eliminating the heat energy generated by the at least one LED light bead 20. The heat dissipation device 30 comprises a copper foil circuit board (i.e., the circuit board 40) and the heat sink 60. The copper foil circuit board has a first copper foil (i.e., the first metal layer 42) and a second copper foil (i.e., the second metal layer 44) located on two opposite sides respectively. The heat dissipation base 26 of the LED light bead 20 is welded to the first copper foil. Wherein the copper foil circuit board has at least one copper-plated heat conductive hole (i.e., the heat conductive hole 46) penetrating through it, the at least one copper-plated heat conductive hole is at least located at a welding area between the heat dissipation base 26 and the first copper foil. Some of the copper-plated heat conductive holes absorb solder tin (i.e., the heat conductive material columns 50) and are connected to the second copper foil on another side of the copper foil circuit board. In addition, some of the copper-plated heat conductive holes are located around the heat dissipation base 26 of the LED light bead 20 and are not filled with solder tin to avoid electrical conduction. The second copper foil is connected to the heat sink 60 with solder tin or high heat conductive silver glue, so that the heat energy generated by the LED light bead 20 can be transferred to the heat sink 60 through the copper-plated heat conduction holes adsorbed with solder tin and without adsorption of solder tin, that is, the first type heat conduction path P1 and the second type heat conduction path P2 shown in FIG. 2.

Moreover, an area of the second copper foil is preferably larger than a connection area (e.g., a welding area) between the second copper foil and the heat sink 60.

Based on the above, the LED light and the heat dissipation device of the same of the disclosure have the following advantages:

(1) The disclosure uses materials with high thermal conductivity coefficients such as solder tin or silver glue, and the heat conductive hole to replace conventional heat dissipation glue and screws, enabling the solder tin/silver glue to be directly connected to the heat sink to achieve effective heat dissipation, thereby improving heat dissipation effects.

(2) Compared with the prior art, the circuit board of the disclosure can achieve good heat dissipation effects using a commercially available circuit board without requiring complicated circuit design and high technics costs.

(3) The copper foil circuit board of the heat dissipation device of the disclosure can be provided with the copper-plated heat conductive holes, wherein some of the copper-plated heat conductive holes are filled with the heat conductive material columns to connect to the LED light bead and the heat sink, and some of the copper-plated heat conductive holes are not filled with the heat conductive material columns, thereby the disclosure can provide a first type heat conduction path and a second type heat conduction path, making the LED light a high heat dissipation LED light.

(4) A sequence of the first type heat conduction path provided by the disclosure is (a) the heat dissipation base of the LED light bead; (b) the first heat conductive material layer/the first metal layer/a third metal layer in the heat conductive hole/the heat conductive material columns under the heat dissipation base; (c) the second heat conductive material layer/the second metal layer on another side of the circuit board; and (d) the heat sink. A sequence of the second type heat conduction path is (a) the heat dissipation base; (b) the first heat conductive material layer/the first metal layer under the heat dissipation base; (c) the heat conductive holes around the heat dissipation base/the third metal layer in the heat conductive holes; (d) the second heat conductive material layer/the second metal layer on the other side of the circuit board; and (e) the heat sink.

(5) The heat dissipation device of the disclosure enables the first heat conductive material layer and the second heat conductive material layer to directly connect with the LED light bead and the heat sink respectively, and the first heat conductive material layer and the second heat conductive material layer can be connected with each other through the heat conductive material columns and/or the first metal layer, the second metal layer and the third metal layer of the circuit board. The LED light of the disclosure can achieve effective heat dissipation and improve heat dissipation effects by directly connecting the LED light bead and the heat sink, for example, with solder tin/silver glue.

(6) An area of the second metal layer of the circuit board is larger than an area of the second metal layer of the circuit board connected to the heat sink through the second heat conductive material layer, thereby improving heat dissipation effects.

(7) Disposing positions of the heat conductive material columns are located at a connection area (such as a welding area) between the LED light bead and the circuit board and at a connection area (such as a welding area) between the heat sink and the circuit board, thereby improving heat dissipation effects.

(8) The LED light of the disclosure can be a high-power LED light.

Note that the specification relating to the above embodiments should be construed as exemplary rather than as limitative of the present disclosure, with many variations and modifications being readily attainable by a person of average skill in the art without departing from the spirit or scope thereof as defined by the appended claims and their legal equivalents.

What is claimed is:

1. A heat dissipation device applicable for eliminating a heat energy generated by at least one LED light bead, comprising:

a circuit board equipped with at least one first metal layer and at least one second metal layer respectively located on two opposite sides, the circuit board having at least one heat conductive hole, wherein the first metal layer of the circuit board is connected to a heat dissipation base of the LED light bead through a first heat conductive material layer, so that the heat energy generated by the LED light bead is transferred from the heat dissipation base to the second metal layer of the circuit board through the first heat conductive material layer, the first metal layer and the heat conductive hole; and a heat sink, wherein the second metal layer of the circuit board is connected to the heat sink through a second heat conductive material layer, so that the heat energy generated by the LED light bead is conducted from the second metal layer to the heat sink through the second heat conductive material layer, wherein materials of the first heat conductive material layer and/or the second heat conductive material layer is/are respectively selected from a group consisting of solder tin and silver glue.

2. The heat dissipation device as claimed in claim 1, wherein an area of the second metal layer of the circuit board is at least larger than an area of the heat sink connected to the second metal layer of the circuit board through the second heat conductive material layer.

3. The heat dissipation device as claimed in claim 1, wherein a position where the heat conductive hole being formed on the circuit board is located in an area where the heat dissipation base of the LED light bead is connected to the first metal layer of the circuit board via the first heat conductive material layer.

4. The heat dissipation device as claimed in claim 1, wherein the heat conductive hole is filled with at least one heat conductive material column connecting with the first heat conductive material layer and the second heat conductive material layer, and the at least one heat conductive material column is used to conduct the heat energy generated by the LED light bead from the first heat conductive material layer to the second heat conductive material layer.

5. The heat dissipation device as claimed in claim 4, wherein material of the heat conductive material column is selected from a group consisting of solder tin and silver glue.

6. The heat dissipation device as claimed in claim 4, wherein material of the heat conductive material column is heat conductive adhesive.

7. The heat dissipation device as claimed in claim 1, wherein the heat conductive hole is formed with a third metal layer on an inner wall of the circuit board to connect with the first metal layer and the second metal layer, and the heat energy generated by the LED light bead is transferred from the heat dissipation base to the second metal layer of the circuit board through the first heat conductive material layer, the first metal layer, the heat conductive hole and the third metal layer in the heat conductive hole.

8. The heat dissipation device as claimed in claim 1, wherein the circuit board is a copper foil circuit board, and the first metal layer and/or the second metal layer are respectively a copper foil or is a copper foil.

9. The heat dissipation device as claimed in claim 1, wherein a material of the heat sink is a pure copper metal.

10. The heat dissipation device as claimed in claim 1, wherein the heat sink is a copper column radiating fin, a water-cooling heat sink, a fan-assisted copper column radiating fin or a fan-assisted water-cooling heat sink.

11. The heat dissipation device as claimed in claim 1, wherein a number of the heat conductive hole is more than one, a plurality of first heat conductive holes among the heat conductive holes are respectively filled with a heat conductive material column, and a plurality of second heat conductive holes among the heat conductive holes are hollow.

12. The heat dissipation device as claimed in claim 11, wherein positions where the first heat conductive holes being formed on the circuit board are located in an area where the heat dissipation base of the LED light bead is connected to the first metal layer of the circuit board via the first heat conductive material layer, and positions where the second heat conductive holes being formed on the circuit board are located outside the area where the heat dissipation base of the LED light bead is connected to the first metal layer of the circuit board via the first heat conductive material layer.

13. The heat dissipation device as claimed in claim 1, wherein the circuit board is a double-layer board or a multi-layer board.

14. An LED light, comprising:

at least one LED light bead; and the heat dissipation device as claimed in claim 1, wherein the LED light bead is disposed on the heat dissipation device for eliminating the heat energy generated by the LED light bead through the heat dissipation device.

15. A heat dissipation device applicable for eliminating a heat energy generated by at least one LED light bead, comprising:

a copper foil circuit board equipped with at least one first copper foil and at least one second copper foil located on two opposite sides, the LED light bead being welded to the first copper foil; and a heat sink, the heat sink being welded to the second copper foil, the copper foil circuit board having at least one copper-plated heat conductive hole, so that the heat energy generated by the LED light bead being transferred to the heat sink through the copper-plated heat conductive hole, wherein a number of the at least one copper-plated heat conductive hole is more than one, and among the copper-plated heat conductive holes, only at least one first copper-plated heat conductive hole located in a welding area between the heat sink and the second copper foil is filled with solder tin or silver glue.

16. The heat dissipation device as claimed in claim 15, wherein an area of the second copper foil is larger than an area of the heat sink where the second copper foil is welded.

17. The heat dissipation device as claimed in claim 14, wherein at least one second copper-plated heat conductive hole among the copper-plated heat conductive holes located outside the welding area between the heat sink and the second copper foil is not filled with solder tin or silver glue.

* * * * *